(12) United States Patent
Taherian et al.

(10) Patent No.: US 6,586,932 B1
(45) Date of Patent: Jul. 1, 2003

(54) ENHANCED PERFORMANCE ANTENNAS FOR NMR LOGGING

(75) Inventors: Reza Taherian, Sugar Land, TX (US); Richard P. Harris, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 10/065,414

(22) Filed: Oct. 16, 2002

(51) Int. Cl.[7] ................................................ G01V 3/00
(52) U.S. Cl. ...................................... 324/303; 324/318
(58) Field of Search ................................ 324/303, 318, 324/322, 306, 309, 312, 314

(56) References Cited

U.S. PATENT DOCUMENTS

| | | | |
|---|---|---|---|
| 5,680,044 A | * 10/1997 | McDougall et al. ........ | 324/303 |
| 5,796,252 A | 8/1998 | Kleinberg et al. | |
| 6,255,818 B1 | 7/2001 | Heaton et al. | |
| 6,366,089 B1 | * 4/2002 | Poitzsch et al. ............ | 324/303 |
| 6,400,147 B1 | 6/2002 | Toufaily et al. | |
| 2001/0033163 A1 | 10/2001 | Sigal et al. | |

FOREIGN PATENT DOCUMENTS

| | | |
|---|---|---|
| GB | 2 364 129 | 1/2002 |
| WO | WO 96/34296 | 10/1996 |
| WO | WO 99/24844 | 5/1999 |

OTHER PUBLICATIONS

RF Sigal et al., "A method for Enhancing the Vertical Resolution of NMR Logs," *SPE 63215*, 2000 SPE Annual Technical Conference and Exh., Dallas, TX Oct. 1–4, 2000 (pp. 733–743).

* cited by examiner

Primary Examiner—Louis Arana
(74) Attorney, Agent, or Firm—Kevin P. McEnaney; Brigitte L. Jeffery; John J. Ryberg (57) ABSTRACT

An antenna design for a downhole nuclear magnetic resonance logging tool is enhanced to shape the resultant RF field generated by the antenna. The enhancement is accomplished by adding additional turns to a portion of the antenna, either circumscribing a ferrite material or located on the surface of an at least partially non-conductive material. The additional turns or half turns in combination with the RF field from parallel antenna portions result in a RF field contribution that is proportionally higher than the RF field contribution from the coil portions which are not enhanced. Further, the total RF field can be shaped over a earth sample region depending on placement of the enhancing turns. In this way, for example, the total RF field can be generated to achieve an orthogonal alignment with a static magnetic field over a larger region of the sample.

40 Claims, 6 Drawing Sheets

ENHANCED PERFORMANCE ANTENNAS FOR NMR LOGGING

BACKGROUND OF INVENTION

1. Field of the Invention

This invention relates generally to nuclear magnetic resonance (NMR) apparatus and techniques for logging wells. More specifically, the invention relates to antenna designs for NMR well logging apparatus.

2. Background Art

Nuclear magnetic resonance (NMR) logging tools measure the amplitude and the decay constant of an NMR signal from the spin nuclei in earth formation, most often protons that are constituents of both water and hydrocarbons. The initial signal amplitude is a measure of total formation porosity while the time decay, invariably multi-exponential, can be decomposed into a distribution of exponential decays with different transverse relaxation times. The transverse relaxation time, $T_2$, is a measure of spin-spin interaction that provides information on the pore size, type of fluid, and hydraulic permeability of the formation. These parameters are important petrophysical quantities, explaining why NMR logging is popular.

The quality of NMR logs is strongly dependent on the signal to noise ratio, S/N, of the measurement. S/N is determined by, among other parameters, the strength of the static magnetic field, the strength of the RF field, and the relative orientation of these two fields in the sensed region. The S/N also depends on the volume of the sensed region. In pulse NMR logging tools, a static magnetic field, $B_0$, along the z-axis, is used to polarize the nuclear spins, causing the individual spins to precess around $B_0$ at the so called Larmor frequency, $\omega$ L. In a typical measurement cycle, the RF field, $B_1$, is used to flip the magnetization to another plane, often perpendicular to the direction of static magnetic filed, to generate an NMR signal in the receiving antenna.

The RF antennas used in NMR instruments can be approximated as magnetic dipoles. NMR logging instruments utilize an inside out design where the sample, a region of an earth formation for example, is outside the NMR instrument. The design of antenna for such applications is demanding. Two existing commercial NMR logging tools use shorted half coax and loop designs.

The RF antennas for NMR logging applications normally operate in the low MHz frequency range where the wavelength is on the order of 100s of meters. The physical length of these antennas is less than a meter and the operating depth from the borehole (DOI) is on the order of centimeters, thus the antenna always operated in the near field condition. This is an important distinction since all the antennas proposed or used in NMR logging are equivalent to simple dipole antennas in the far field, but they have much more complicated near field behavior.

Pulsed NMR instruments contain means of generating a DC magnetic field, B0, for aligning the nuclear spins, thereby producing a nuclear magnetization that initially is along the direction of B0. In addition an antenna is used for generating RF pulses, B1, that manipulate the nuclear magnetization and lead to measurable NMR signals. In principle, S/N is at a maximum when the orientation of B0 and B1 are orthogonal.

One of the widely used antennas in the field of communications is the simple loop antenna that is usually made with circular or square shape. A variant of this antenna that is used in NMR applications is the surface loop (SL) antenna. The name stems from the fact that loop is placed on, and takes the curvature of, the sensor surface. This makes the antenna as close as possible to the sample (earth formation). To further enhance the efficiency, these antennas are preferably placed on the surface of a material having high magnetic permeability, such as soft ferrites or other non-conductive material.

Other antenna enhancements have included multi-turn antennas or antennas having multiple windings to increase the total RF field generated by the antenna. With each additional turn, the RF field from that winding is approximately summed with the RF field from parallel windings. However, the efficiency of the coil is proportional to the amount of electric current flowing through the windings. As the number of turns increases, the impedance of the coil increases, which, for the same voltage source, leads to a lower current through the coil. Thus, for antennas having a good impedance match with the voltage source, additional turns alone does not lead to any B1 enhancement. Even if increased impedance improves antenna matching, such as one improperly matched at the outset, the antenna enhancement is seen across the entirety of the radiating surface of the antenna coil. Since, for NMR purposes, only the component of B1 that is orthogonal or nearly orthogonal to B0 is preferred, enhancing B1 at all points of the coil is not the most efficient approach.

SUMMARY OF INVENTION

An antenna coil in a downhole NMR measurement device includes at least a first coil portion that contributes to the total RF field generated by the antenna coil. Portions of the coil are enhanced so that the enhanced coil portions contribute a higher proportional contribution to the total RF field than the unenhanced coil portion.

According to an embodiment, the antenna enhancement is achieved by providing additional windings at or near the portion of the antenna coil that is to be enhanced.

Another enhanced antenna design utilizes an enlarged portion of the antenna coil in place of the additional windings.

DETAILED DESCRIPTION

According to the disclosed subject matter, signal intensity can be increased by enhancing the RF field that is radiated in a sample of earth formation. Specifically, a NMR antenna can be designed such to increase the amount of the RF field, B1, that is orthogonal to the static magnetic field, B0. The NMR antenna is partitioned into multiple segments or portions, each capable of generating an approximate two-dimensional RF field. Depending on the direction of B0, one or more portions of the antenna are enhanced to generate a higher contribution to the total RF field that is output by the antenna than without the enhancement. Because, the remaining portions of the antenna are left without enhancement, the total RF field comprises a higher proportional contribution from the enhanced antenna portions compared to the un-enhanced portions. In this way, the total RF field directional components can be manipulated depending on the portion of the antenna that is enhanced and the amount of enhancement that is made.

Figure 1A:
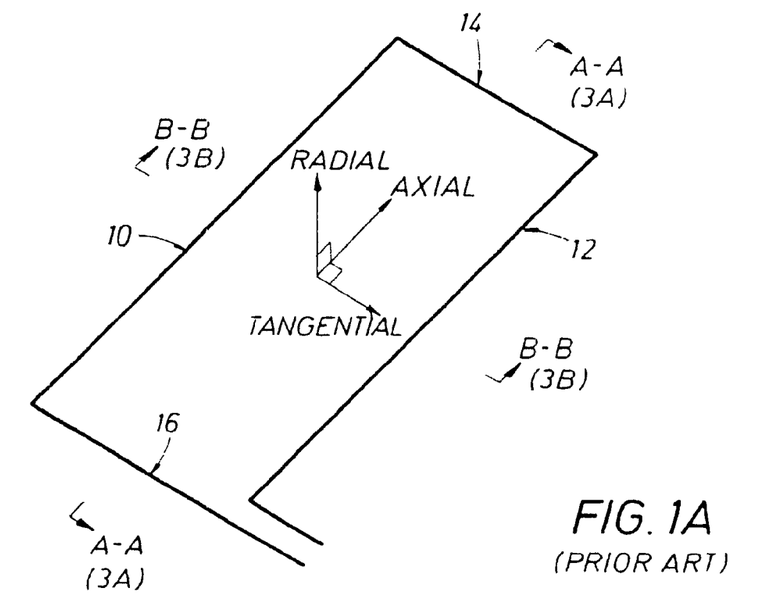
FIGS. 1A and 1B are illustrations of prior art flat and curved surface loop antennas.
Figure 1B:
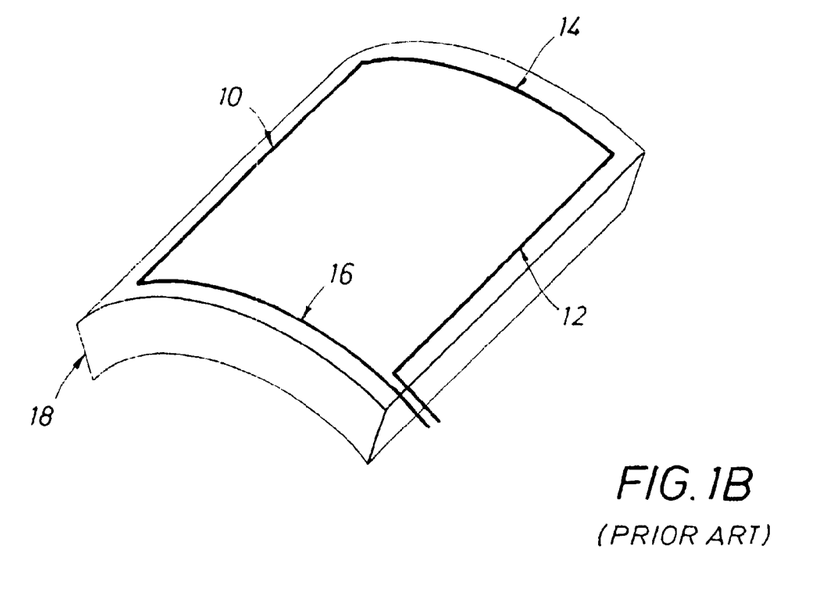

Turning to FIGS 1A and 1B, shown are both flat and curved square surface loop antennas. It is known that the current in the antenna conductor forms a loop and leads to a radiation pattern that in the far field is equivalent to that from a point magnet dipole antenna. Although magnetic-dipole description of the loop antenna is fairly adequate for most cases, in NMR logging applications more detailed study is needed. This is because only the components of B1 that are perpendicular to B0 are effective in changing the direction of magnetization vector. Thus, the NMR signal from each point in the sensitive region is maximum when the inner product of B1 and B0 vectors, $B1.B0 = B1a \times B0a + B1t \times B0t + B1r \times B0r$, is minimum, where "a" represents an axial component, "t" represents a tangential component and "r" represents a radial component.

For the loop illustrated in FIG. 1 the two sides 10 and 12 are oriented along the axis of the tool (in the axial direction) while the remaining two sides 14 and 16 (ends) are in the tangential direction. As current flows across the antenna conductors the near B1 field from sides 10 and 12 has tangential and radial components, given by the right hand rule. This is different from the RF field originating from sides 14 and 16 that rotate in the axial and radial directions about the antenna conductor.

Figure 2A:
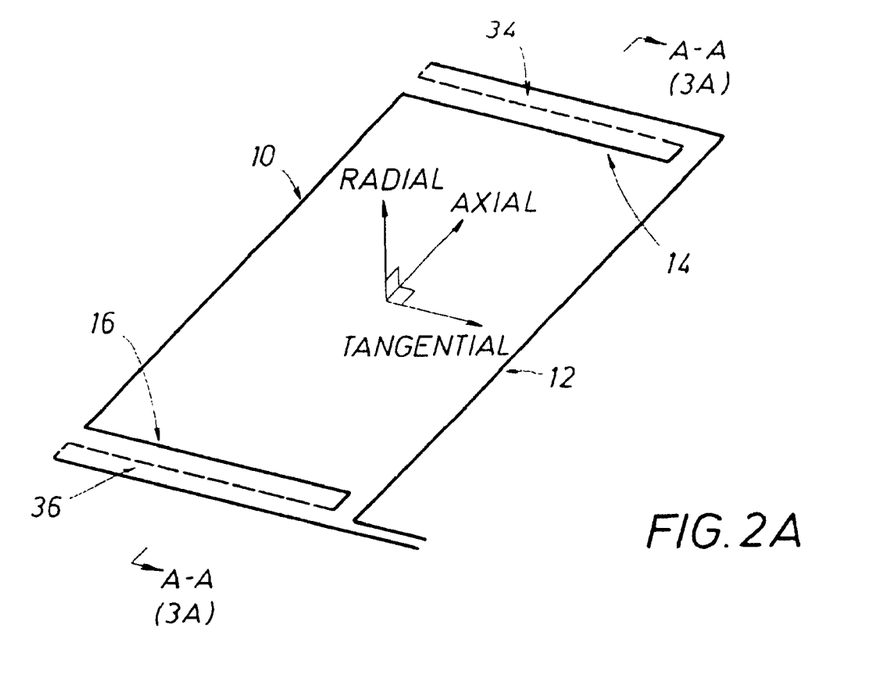
FIGS. 2A, 2B, 2C and 2D are exemplary embodiments of flat and curved surface loop enhanced antennas.
Figure 2B:
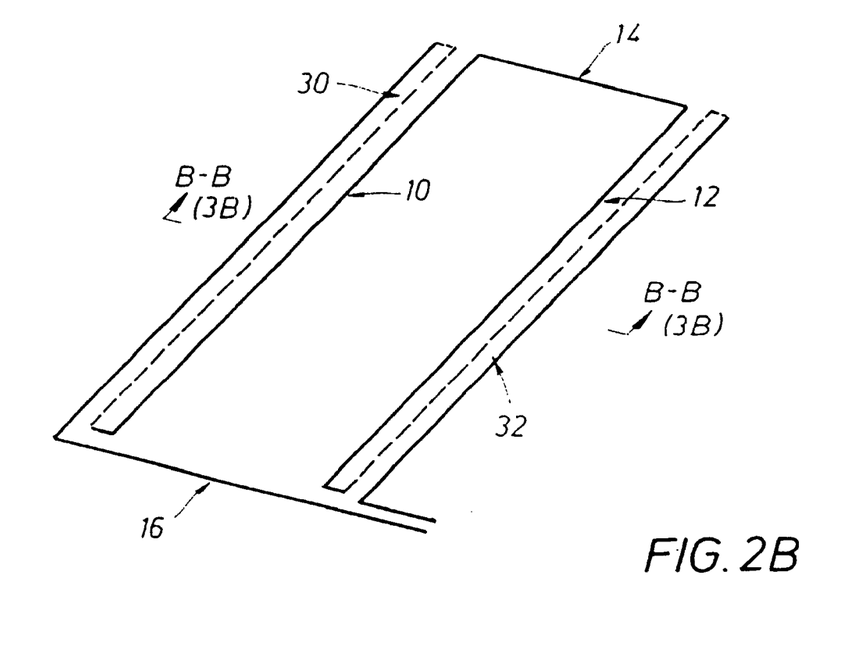
Figure 2C:
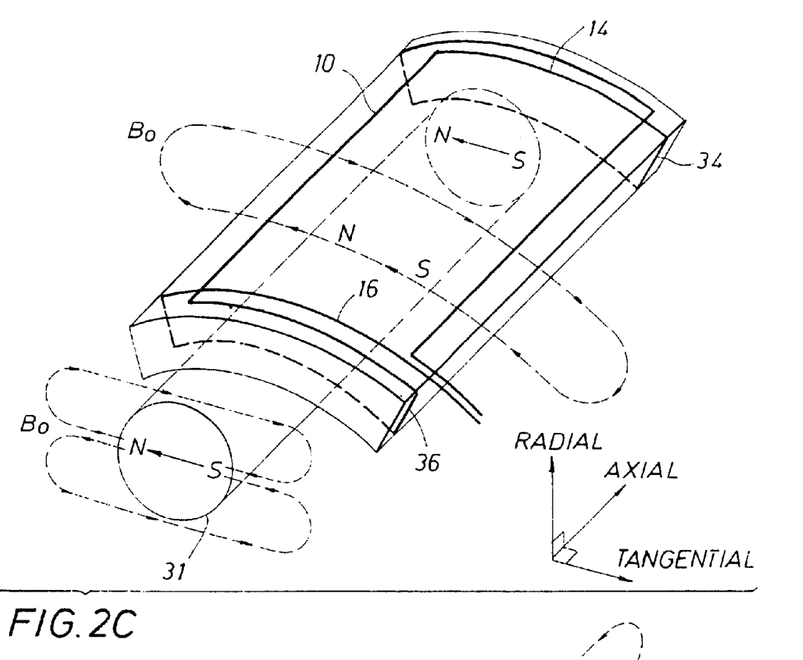
Figure 2D:
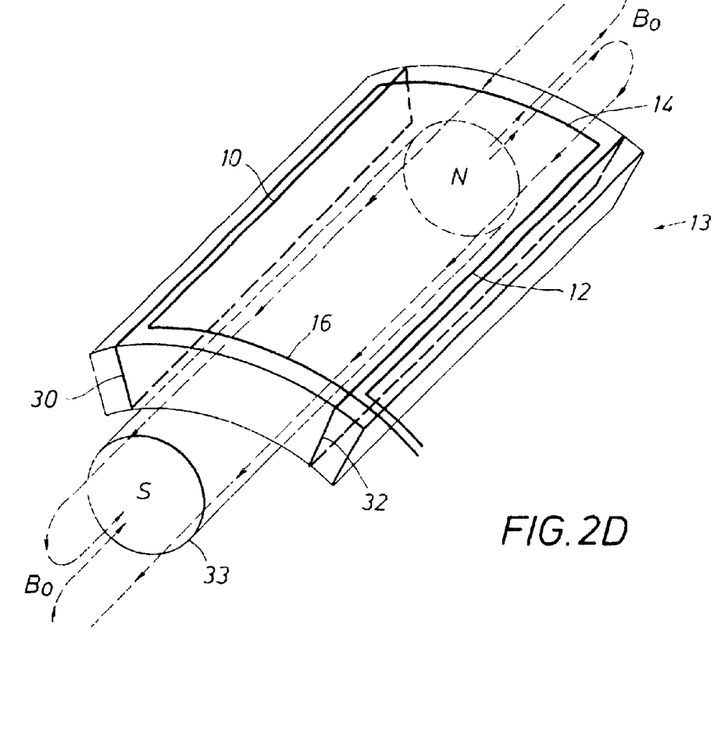

Turning to FIGS. 2A 2D, according to one embodiment, shown are two enhanced antennas resulting from enhancements or modifications on the antenna of FIG. 1. In this and the following figures the solid lines represent current lines that are positioned on top of the antenna form while the dashed lines are for current lines that are under the antenna form. For example, the lines of antenna turns 30, 32, 34, and 36 in FIGS. 2C and 2D represent additional coil windings around the circumference of the ferrite material 18, or other non-conductive material, of FIG. 1B. As is the case for all of the embodiments, these same lines representing additional coil turns around the ferrite material 18 also, alternatively, represent additional coil portions or coil turns placed on the surface of the ferrite 18 or other non-conductive material.

In the case of an enhanced antenna, shown for example in FIG. 2A, the current in the loop circulates through an extra turn on each end causing more radiation to be emitted from sides 14 and 34, and 16 and 36. Thus the total RF field emitted from the antenna receives a proportionally larger contribution from the enhanced sides 14 and 16 (including additional windings 34 and 36) than from un-enhanced sides 10 and 12. Depending on impedance and other requirements from the antenna driving circuits (not shown) and the particular application, additional turns may be added. For example, where additional coil turns are added, the impedance of the antenna coil increases. This impedance value must be matched by the associated driving circuit (not shown).

Additional coil turns are appropriate where the contribution to the total RF field from the enhanced coil portion is not sufficient to achieve the needed return NMR signal intensity. For example, in FIG. 2A, if B0 is asymmetric when viewed around coil portion 14 compared to coil portion 16, and if B0 at coil portion 16 is more orthogonal to B0 than at coil portion 14, it may be advantageous to enhance coil portion 16 more than coil portion 14 is enhanced. This can be done, for example, by only one enhanced turn at coil portion 14, but multiple enhanced turns at coil portion 16. Alternatively, coil portion 14 may be implemented without additional turns while coil portion 16 is implemented with half, one or more additional turns, thereby resulting in a combined enhanced coil portion, but shaped to be stronger over a region near coil portion 16. Thus, placement of the enhancing turns is, according to an embodiment, used to shape the B1 field to better match the B0 field. In this case, the B1 field is shaped to achieve improved orthogonality with the B0 field across a larger region.

The extra turns do not have to be positioned at the two longitudinal ends as in FIG. 2A. In FIG. 28, another embodiment is shown in which extra turns 30 and 32 are added to the tangential portions of the coil.

The design choice of which coil portion to enhance depends on a number of factors, but primarily on the field pattern of the static magnetic field B0. Since NMR signal intensity is higher when the orientation of B1 and B0 is orthogonal, the contribution from the portion of the coil which maximizes this relationship should be enhanced. This is shown in FIGS. 2C and 2D, representing the three-dimensional configurations for the antenna shown in FIG. 2B. Although other factors may alter the configuration, under normal conditions the antenna enhanced at the longitudinal ends, such as shown in FIGS. 2A and 2C, is most suited where the magnet polarization direction B0, is in the tangential direction, such as magnet 31. Likewise, although other factors may alter the configuration, under normal conditions the antenna enhanced at the tangential ends, such as shown in FIGS. 2B and 2D, is most suited where the magnet polarization direction is in the axial direction as is magnet 33. This is discussed in more detail below with reference to FIGS. 3A and 3B.

Figure 3A:
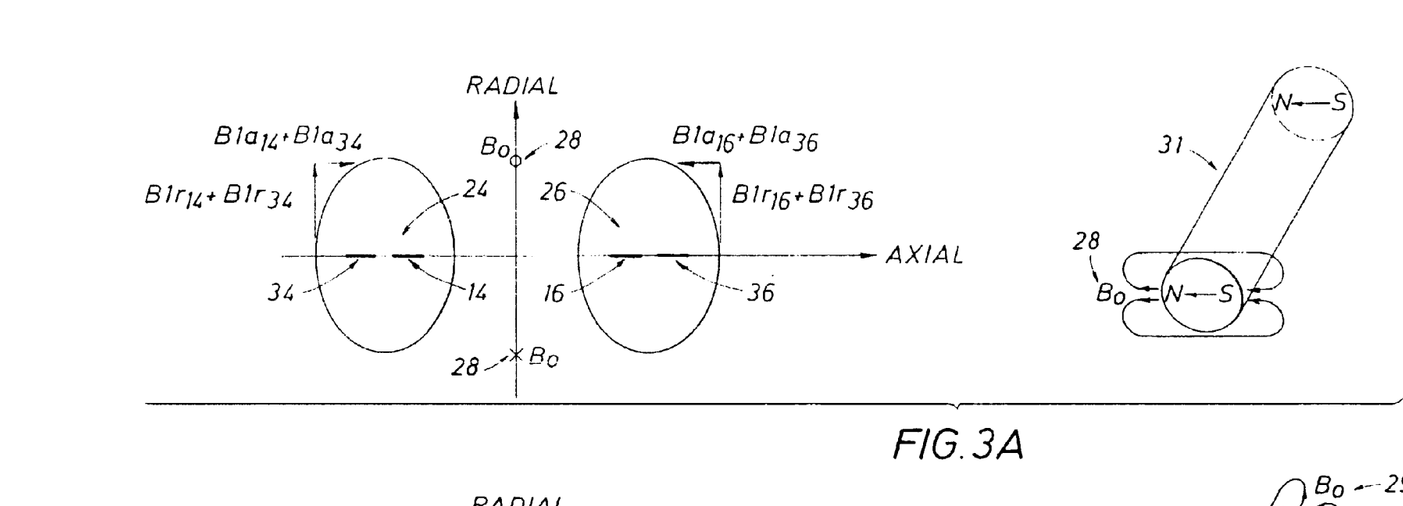
FIGS. 3A and 3B are magnetic and RF field diagrams for the antennas of FIG. 2.

Turning to FIG. 3A, shown are the simplified field patterns associated with the enhanced coils of FIGS. 2A and 2C. FIG. 3A is viewed from the cross-section A—A, shown in FIG. 2A. The coil portions 14 and 16 produce a B1 field which rotates about the direction of the current path according to the right-hand rule. Because the current is traveling along the tangential direction through sides 14 and 16, the generated B1 field is comprised of an axial $B1a_{14}$, $B1a_{16}$ and a radial $B1r_{14}$, $B1r_{16}$ component at any given point along the field map. The additional turn along sides 14 and 16 illustrated in FIGS. 2A and 2C, is shown in the cross section A—A as coil portions 34 and 36 respectively (for clarity, only the top coil portions are shown). These parallel traces essentially add to the B1 field generated by sides 14 and 16 an axial component $B1a_{34}$, $B1a_{36}$ and a radial component $B1r_{34}$, $B1r_{36}$.

Figure 3B:
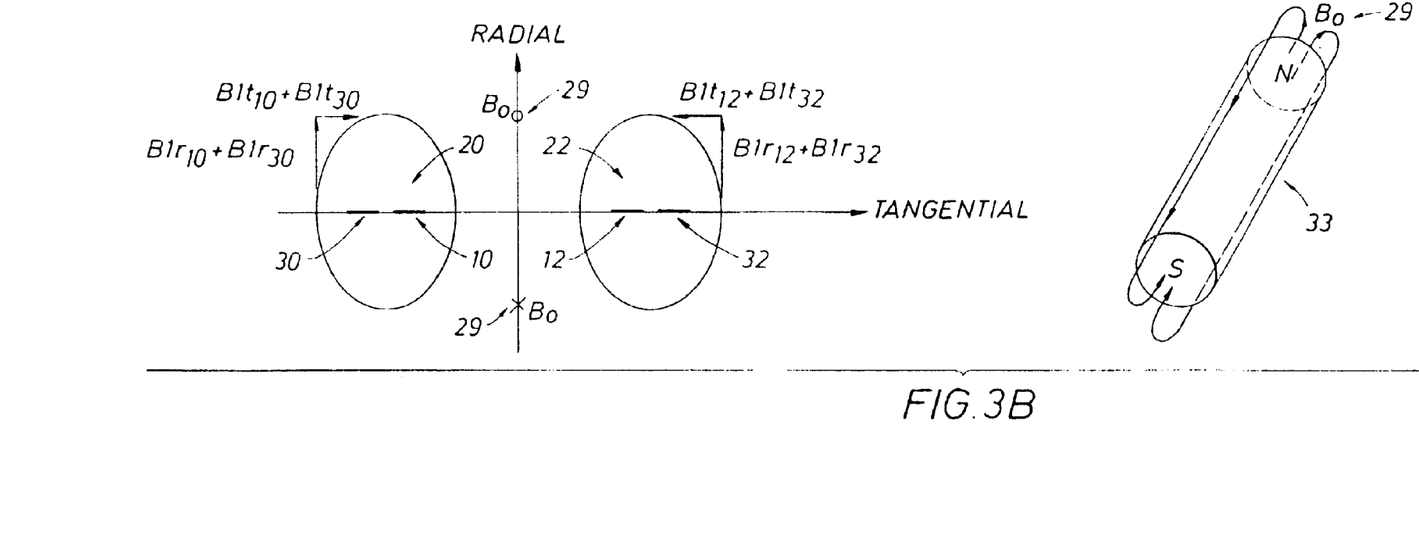

Turning to FIG. 3B, shown are the simplified field patterns associated with the enhanced coils of FIGS. 2B and 2D. FIG. 3B is a diagram of the RF field viewed from the cross-section B—B, shown in FIG. 2B. The coil portions 10 and 12 produce a B1 field which rotates about the direction of the current path according to the right-hand rule. Because the current is traveling along the axial direction through sides 10 and 12, the generated B1 field is comprised of a tangential $B1t_{10}$, $B1t_{12}$ and a radial $B1r_{10}$, $B1r_{12}$ component at any given point along the field map. The additional turn along sides 10 and 12 illustrated in FIGS. 2A and 2C, is shown in the cross section B—B as coil portions 30 and 32 respectively. These parallel traces essentially add to the B1 field generated by sides 10 and 12 a tangential component $B1t_{10}$, $B1t_{12}$ and a radial component $B1r_{10}$, $B1r_{12}$.

Continuing with FIG. 3A, with reference to FIG. 2C, the B0 field 28 is generated from a radial dipole magnet 31. The B0 pattern is in the tangential and radial directions, indicated by an "O" for the B0 field exiting the radial-axial plane and an 'X' for the B0 field entering the radial-axial plane. In particular, at the center of the NMR sensitive region, where a large portion of the NMR signal is generated, the B0 field is purely tangential. This B0 field 28 does not contain an axial or B0a component. Since there is no B0a, the antenna sides that generate B1 in the axial direction are most appropriate to be used with this magnet 31. In other words, any axial component of B1 is orthogonal with the B0 field having only radial and tangential components.

From FIG. 3A, radiation from sides 14 and 16 generate an RF field with a radial, B1r, and an axial, B1a, component. From FIG. 3B, radiation from sides 10 and 12 do not produce an RF field with an axial component. Thus, coil portions 14 and 16 are more effective for the radial magnet 31 than the RF field radiated from sides 10 and 12. Thus, for this particular choice of B0, antenna portions 14 and 16 are enhanced with additional coil turns 34 and 36, respectively. In this way, the RF field generated from each enhanced portion is the sum of the RF fields generated by each coil winding in that portion. Specifically, for coil portion 14, the axial component is at least doubled, $B1a_{14}+B1a_{34}$. Likewise, for coil portion 16, the axial component is also at least doubled, $B1a_{16}+B1a_{36}$. The result is that the total RF field from the antenna configuration 11 (FIG. 2C) receives a greater proportional contribution from coil portions 14 and 16 (containing windings 34 and 36), which include the desired axial RF field component, compared to the contribution from coil portions 10 and 12. The radial components of the enhanced coil portions 14 and 16 also contribute a proportionally greater radial RF field to the total RF field compared to the radial B1 field contributed by coil portions 14 and 16 alone.

Turning to FIGS. 2B, 2D and 3B, according to another embodiment, the B0 field 29 is generated from an axial dipole. The B0 pattern in the center of the tool is in the axial and radial directions, indicated by "O" for the B0 field exiting the radial-tangential plane and an "X" for the B0 field entering the radial-tangential plane. This B0 field 29 does not contain a tangential or B0t component. Since there is no B0t, the B1 for sides 10 and 12 which generate a B1 component in the tangential direction would be more orthogonal to B0 and thus are favored. Using a similar analysis as above, for coil portion 10, the tangential component is at least doubled, $B1t_{10}+B1t_{30}$. Likewise, for coil portion 12, the tangential component is also at least doubled, $B1t_{12}+B1t_{32}$. The result is that the total RF field from the antenna configuration 13 (FIG. 2D) receives a greater proportional contribution from coil portions 10 and 12 (containing windings 30 and 32), which include the desired tangential RF field component, compared to the contribution from coil portions 14 and 16. As above, the radial components of the enhanced coil portions 10 and 12 also contributes a proportionally greater radial RF field to the total RF field compared to the radial B1 field contributed by coil portions 10 and 12 alone.

Further, another embodiment having a permanent magnetic dipole along the radial direction leads to a B0 pattern similar to FIG. 3A, but shifted by ninety degrees. In this embodiment, the B0 pattern also does not have an axial component and a field map and antenna enhancement similar to that discussed above in reference to FIG. 3A applies. Although not shown as a representative figure, any other orientation, for example a degree shift of less than ninety degrees, of the B0 dipole constitutes some linear combination of the above two embodiments (FIG. 3A and 3B).

It should be noted that the additional windings need not be located along the ends of the antenna sides, for example in the case of a rectangular antenna. According to another embodiment, additional windings or turns 40 are made at a point near the middle of the antenna loop, shown in FIG. 4. At least one effect of this variation is to weight the total RF field generated by the antenna more heavily near the center of the antenna. Since the region of earth sample that is affected by the NMR instrument is essentially the region of sample that corresponds to the antenna shape, the RF field in the sample will also be weighted in a similar manner.

Essentially the coil enhancement allows the B1 field to the shaped to improve, for example, orthogonality with the B0 field over a larger region. This design has advantages, for example, in longer antenna designs to provide a more evenly distributed RF field across the length of the antenna. In other words, the RF field contribution from the coil portions 16 and 14, even with enhancing turns such as in FIG. 2C, is reduced as the distance from the extra windings increase. For a long antenna, the enhanced field component may be ineffective near the middle portion of the antenna length when the enhancing turns are located near, for example, sides 14 and 16. Placement of the additional turns 40 at a location between the sides 14 and 16, results in a more evenly distributed enhanced field contribution along the coil length. The same is true for an enhancing antenna design where a tangential field component, for example, is desired using additional windings along the axial of the antenna, parallel to and between sides 10 and 12. Further embodiments locating coil enhancing turns relate generally to circumstances where B0 is across a tested region, such that the B1 field is shaped to match the B0 field over a larger region than would be the case if left unenhanced.

Figures 4, 5:
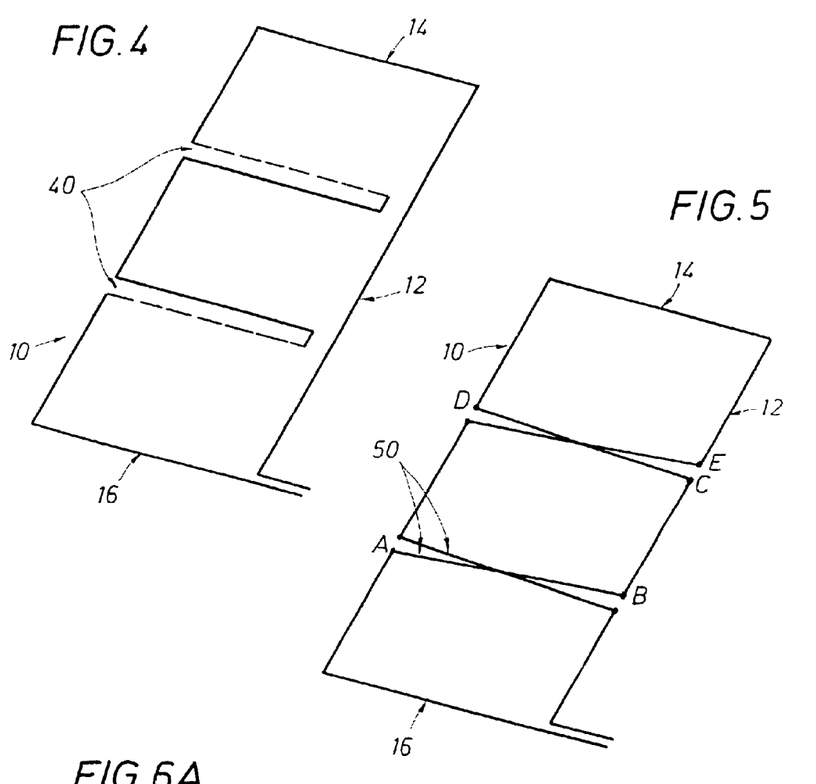
FIG. 4 is an illustration of another embodiment of an enhanced surface antenna.
FIG. 5 is an exemplary embodiment of an antenna enhanced by multiple coil half-turns.

Furthermore, the enhancing turns do not need to be whole turns. FIG. 5 shows another embodiment where half turns 50 are used to enhance the antenna. FIG. 5 illustrates half turns parallel to sides 14 and 16 on a surface loop antenna. The half turns 50 are made by running the coil along antenna portion 10 to point A, crossing to antenna portion 12 to point B, running the coil along antenna portion 12 to point C, then again crossing to antenna portion 10 to point D, running the coil along antenna portion 10, turning the coil along antenna portion 14 and repeating the process in reverse beginning with antenna portion 12 at point E. According to one embodiment, half turns are preferred where parasitic coupling between the antenna and the nearby metal parts are an issue. Specifically, the half turns remain on the surface of the ferrite, for example, leaving separation between the additional coil portions and any metal components within the tool, typically found on the other side of the ferrite.

A similar configuration is contemplated for a coil which places the half turns by wrapping around a portion of the circumference of a ferrite material, such as FIG. 1B. The half turn enhancing configuration is equally available for additional partial windings in a direction parallel to sides 10 and 12, for example where the enhancement is desired to enhance the tangential RF field component. Further, any combination of whole and half turns is contemplated and would require only minor modifications to the disclosed embodiments. For example, as mentioned above, depending on the loading effect of the windings, the driving circuit may require modifications at least to match the antenna impedance value. Specifically, for existing NMR logging tools, it may be desirable to incorporate the highest number of turns or portions thereof yet remain within impedance limits of the associated existing driver circuits. According to one embodiment, a single turn circumscribing the ferrite material at each end of the magnet has proved compatible with driver circuits used on present day typical NMR logging tools.

Figure 6A:
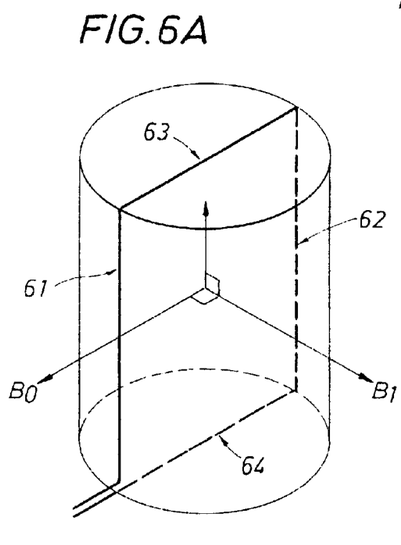
FIGS. 6A and 6B are illustrations of an enhanced antenna for a centralized NMR logging tool.
Figure 6B:
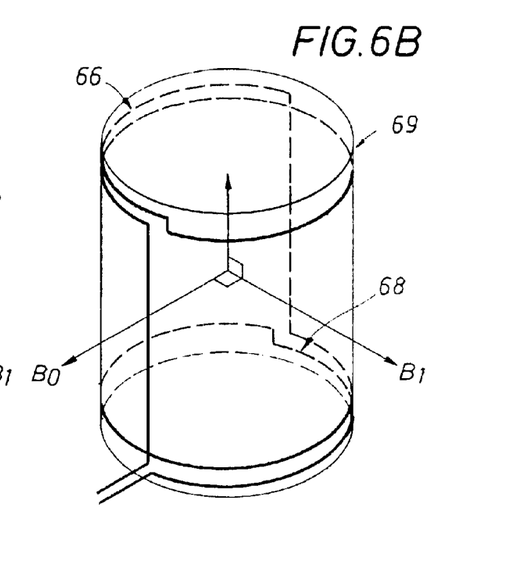

Turning to FIG. 6, another common existing NMR tool design is known as a centralized tool. A typical loop antenna used for centralized tools is shown in FIG. 6A. According to one embodiment applying the disclosed coil enhancement to a centralized logging tool, FIG. 6B illustrates use of an enhancing turn with a top turn 66 and a bottom turn 68 adjacent the non-conductive material 69. This antenna enhances the performance of the simple loop by concentrating more B1 in the two axial ends. The same concepts discussed in reference to the pad tool design apply to the centralized tool design. Specifically, according to one embodiment, the coil enhancements are made to shape the B1 field to be more orthogonal with the B0 field across a larger region than if left unenhanced. In addition the enhancing turn brings the radiating elements closer to the borehole wall where the NMR signal is to be generated and detected. This last point reduces (but does not eliminate) the loading effect of conductive mud in the borehole and improves the antenna performance even more.

Figures 7A, 7B, 7C:
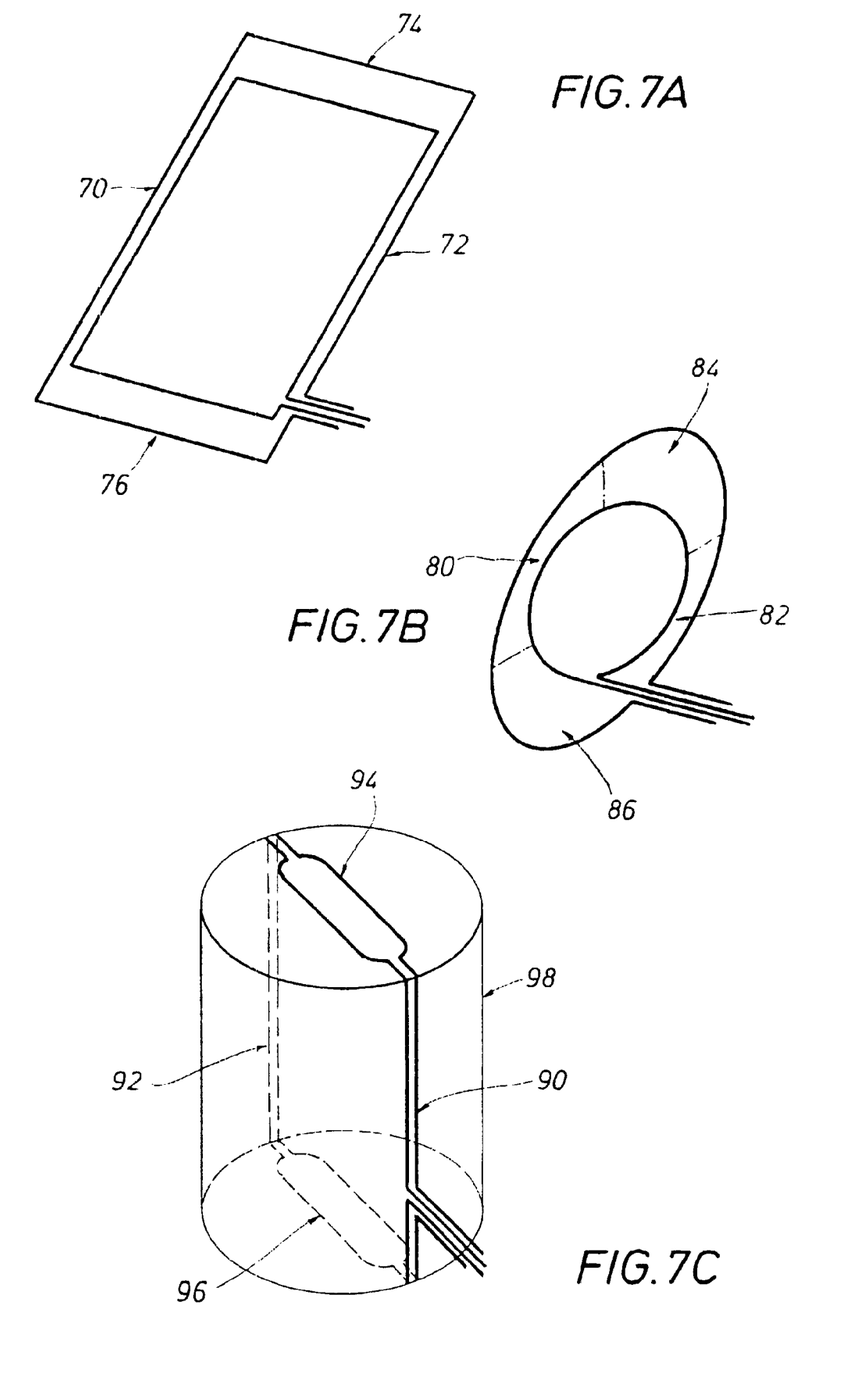
FIGS. 7A, 7B and 7C are alternative embodiments of enhanced antennas.

Although, antenna enhancement has thus far been discussed in terms of additional whole or partial coil windings or turns, other enhancements are contemplated which selectively increase the contribution from one or more portions of a coil to the total RF field generated by the entire coil. FIG. 7A illustrates an alternative embodiment incorporating elongated coil portions 74 and 76 while in conjunction with un-enhanced portions 70 and 72. Similarly, FIG. 7B incorporates enlarged portions 84 and 86 of a circular antenna which merge with un-enhanced portions 80 and 82 at indistinct boundaries. The same principles can be applied to the centralized tool design shown in FIG. 7C. According to one embodiment, the antenna design incorporates elongated coil portions 94 and 96 while in conjunction with un-enhanced portions 90 and 92. In each of FIGS. 7A, 7B and 7C, the antenna is enhanced by concentrating more B1 in the axial ends.

The forgoing disclosure and description of the various embodiments are illustrative and explanatory thereof, and various changes to the NMR acquisition sequence, the logging process, the materials utilized in the antenna design, the organization of the components and the order and timing of the steps taken, as well as in the details of the illustrated system may be made without departing from the disclosed subject matter.

What is claimed is:

1. An NMR antenna apparatus, comprising:
   a non-conductive material;
   a coil located adjacent the non-conductive material for generating a total RF field in a sample of earth formation, comprising:
   a first coil portion for generating a first RF field contribution to the total RF field; and
   an enhanced coil portion for generating an enhanced RF field contribution to the total RF field, the enhanced RF field contribution being a proportionally higher contribution to the total RF field than the first RF field contribution.

2. The NMR antenna of claim 1, wherein the enhanced coil portion comprises at least one additional turn circumscribing the non-conductive material.

3. The NMR antenna of claim 1, wherein the coil is comprised of a coil material and the enhanced coil portion comprises an enlarged portion of a coil material.

4. The NMR antenna of claim 1, wherein the enhanced coil portion comprises at least a portion of an additional turn on a surface of the non-conductive material.

5. The NMR antenna of claim 1, wherein the enhanced coil portion comprises two opposite sides of a rectangular shaped antenna.

6. The NMR antenna of claim 1, wherein the shape of the enhanced coil portion is based on a magnetic field direction in the sample.

7. The NMR antenna of claim 1, wherein the location of the enhanced coil portion is based a magnetic field direction in the sample.

8. The NMR antenna of claim 1, wherein the total RF field is generated during wellbore drilling.

9. The NMR antenna of claim 1, wherein the enhanced coil portion is utilized to shape the total RF field in a manner that nearly maximizes orthogonality between the total RF field and a magnetic field over a region of the sample.

10. The NMR antenna of claim 1, the enhanced coil further comprising:
    a first enhanced coil portion for generating a first enhanced RF field contribution to the total RF field; and
    a second enhanced coil portion for generating a second enhanced RF field contribution to the total RF field.

11. The NMR antenna of claim 10, wherein the second enhanced RF field contribution being a proportionally higher contribution to the total RF field than the first enhanced RF field contribution.

12. A method of producing from an antenna coil a total RF field in a sample of earth formation, the method comprising the steps of:
    generating from a first portion of the antenna coil a first RF field contribution to the total RF field;
    enhancing a current path over an enhanced portion of the antenna coil; and
    generating from the enhanced portion of the antenna coil an enhanced RF field contribution to the total RF field that is a proportionally greater contribution to the total RF field than the first RF field.

13. The method of claim 12, wherein the enhancing step comprises at least one additional antenna coil turn around a non-conductive material.

14. The method of claim 12, wherein the enhanced portion of the antenna coil comprises an enlarged portion of a coil material.

15. The method of claim 12, wherein the enhancing step comprises at least a portion of an additional antenna coil turn on a surface of a non-conductive material.

16. The method of claim 12, wherein the enhanced portion of the antenna coil comprises two opposite sides of a rectangular shaped antenna.

17. The method of claim 12, wherein the shape of the enhanced coil portion is based on a magnetic field direction in the sample.

18. The method of claim 12, wherein the location of the enhanced coil portion is based on a magnetic field direction in the sample.

19. The method of claim 12, wherein the total RF field is generated during wellbore drilling.

20. The method of claim 12, wherein a combination of the first RF field contribution and the enhanced RF field contribution cause the total RF field to have a more orthogonal alignment with a static magnetic field in the sample than without the enhanced portion of the antenna coil.

21. The method of claim 12, the enhanced coil further comprising a first enhanced coil portion and a second enhanced coil portion, the method further comprising the steps of:
generating from the first enhanced coil portion a first enhanced RF field contribution to the total RF field; and
generating from a second enhanced coil portion a second enhanced RF field contribution to the total RF field.

22. The method of claim 21, wherein the second enhanced RF field contribution being a proportionally higher contribution to the total RF field than the first enhanced RF field contribution.

23. A method generating a total RF field from an antenna coil in a sample of an earth formation, comprising the steps of:
generating from a first portion of the antenna coil a first contribution to the total RF field;
generating from a second portion of the antenna coil a second contribution to the total RF field, the second contribution is a proportionally greater contribution to the total RF field than the first contribution;
shaping the total RF field across a region of the sample based on the combination of the first and second contributions.

24. The method of claim 23, wherein the shaping step achieves a total RF field having an amplitude that is nearly consistent across the region.

25. The method of claim 23, wherein the shaping step achieves a total RF field having an improved orthogonal alignment with a static magnetic field across the region than without the shaping.

26. The method of claim 23, wherein the second portion comprises at least two side of the antenna coil in combination with at least a portion of an additional coil turn.

27. The method of claim 23, wherein the shaping step comprises the second portion of the antenna having at least a portion of an additional antenna coil turn.

28. The method of claim 27, wherein the at least a portion of an additional antenna coil turn is located between two ends of the antenna coil.

29. The method of claim 27, wherein the at least a portion of an additional antenna coil turn is located at least at one end of the antenna coil.

30. An NMR measurement apparatus, comprising:
a magnet;
a non-conductive material;
a driving circuit;
a coil coupled to the driving circuit, the coil located adjacent the non-conductive material for generating a total RF field in a sample of earth formation, comprising:
a first coil portion for generating a first RF field contribution to the total RF field; and
an enhanced coil portion for generating an enhanced RF field contribution, the enhanced RF field contribution being a proportionally higher contribution to the total RF field than the first RF field contribution.

31. The NMR measurement apparatus of claim 30, wherein the enhanced coil portion comprises at least one additional turn circumscribing the non-conductive material.

32. The NMR measurement apparatus of claim 30, wherein the coil is comprised of a coil material and the enhanced coil portion comprises an enlarged portion of a coil material.

33. The NMR measurement apparatus of claim 30, wherein the enhanced coil portion comprises at least a portion of an additional turn on a surface of the non-conductive material.

34. The NMR measurement apparatus of claim 30, wherein the enhanced coil portion comprises two opposite sides of a rectangular shaped antenna.

35. The NMR measurement apparatus of claim 30, wherein the shape of the enhanced coil portion is based on a magnetic field direction in the sample.

36. The NMR measurement apparatus of claim 30, wherein the location of the enhanced coil portion is based a magnetic field direction in the sample.

37. The NMR measurement apparatus of claim 30, wherein the total RF field is generated during wellbore drilling.

38. The NMR measurement apparatus of claim 30, wherein the enhanced coil portion is utilized to shape the total RF field in a manner that nearly maximizes orthogonality between the total RF field and a magnetic field over a region of the sample.

39. The NMR measurement apparatus of claim 30, the enhanced coil further comprising:
a first enhanced coil portion for generating a first enhanced RF field contribution to the total RF field; and
a second enhanced coil portion for generating a second enhanced RF field contribution to the total RF field.

40. The NMR measurement apparatus of claim 39, wherein the second enhanced RF field contribution being a proportionally higher contribution to the total RF field than the first enhanced RF field contribution.

* * * * *